US010013507B2

(12) United States Patent
Zhang et al.

(10) Patent No.: US 10,013,507 B2
(45) Date of Patent: Jul. 3, 2018

(54) LEARNING SYNTHETIC MODELS FOR ROOF STYLE CLASSIFICATION USING POINT CLOUDS

(71) Applicant: HERE Global B.V., Eindhoven (NL)

(72) Inventors: Xi Zhang, Chicago, IL (US); Xin Chen, Evanston, IL (US)

(73) Assignee: HERE Global B.V., Eindhoven (NL)

( * ) Notice: Subject to any disclaimer, the term of this patent is extended or adjusted under 35 U.S.C. 154(b) by 837 days.

(21) Appl. No.: 14/320,167

(22) Filed: Jun. 30, 2014

(65) Prior Publication Data

US 2015/0006117 A1    Jan. 1, 2015

Related U.S. Application Data

(60) Provisional application No. 61/841,630, filed on Jul. 1, 2013.

(51) Int. Cl.
*G06F 17/50* (2006.01)

(52) U.S. Cl.
CPC ...... *G06F 17/5004* (2013.01); *G06F 17/5009* (2013.01); *G06F 17/5018* (2013.01)

(58) Field of Classification Search
CPC ............. G06F 17/5004; G06F 17/5018; G06F 17/5009
See application file for complete search history.

(56) References Cited

U.S. PATENT DOCUMENTS

| 4,901,362 | A | * | 2/1990 | Terzian | ..................... G06K 9/50 382/103 |
| 8,553,942 | B2 | | 10/2013 | Lynch | |
| 2004/0041805 | A1 | * | 3/2004 | Hayano | ................... G06T 15/00 345/419 |
| 2008/0021683 | A1 | * | 1/2008 | Rahmes | .............. G06F 17/5004 703/7 |
| 2013/0321392 | A1 | * | 12/2013 | van der Merwe | ..... G01C 21/20 345/419 |
| 2014/0267627 | A1 | * | 9/2014 | Freeman | ............... G01S 17/023 348/47 |

OTHER PUBLICATIONS

Milde et al., "Building Reconstruction Using a Structural Description Based on a Formal Grammar", The International Archives of the Photogrammetry, Remote Sensing and Spatial Information Sciences, vol. XXXVII, Part B3b, Beijing 2008.*

(Continued)

*Primary Examiner* — Kamini S Shah
*Assistant Examiner* — Steven W Crabb
(74) *Attorney, Agent, or Firm* — Alston & Bird LLP

(57) ABSTRACT

Systems, apparatuses, and methods are provided for three-dimensional modeling of building roofs using three-dimensional point cloud data. Point cloud data of a roof of a building is received, and roof data points are selected or extracted from the point cloud data. Semantic type classifications are calculated for each selected roof data point. Roof styles are determined from the semantic type classifications, and a synthetic model of the roof and building is rendered based on the determined roof style.

19 Claims, 11 Drawing Sheets

(56) References Cited

OTHER PUBLICATIONS

Habib et al., "Integration of Lidar and Airborne Imagery for Realistic Visualization of 3D Urban Environments" The International Archives of the Photogrammertry, Remote Sensing and Spatial Information Sciences, vol. XXXVII (2008), pp. 619-620.*
Cote et al., "Automatic Rooftop Extraction in Nadir Aerial Imagery of Suburban Regions Using Corners and Variational Level Set Evolution" IEEE Transactions of Geoscience and Remote Sensing, vol. 51, No. 1, Jan. 2013.*
Bernardini et al., The Ball-Pivoting Algorithm for Surface Reconstruction, 1999, pp. 349-359, Visualization and Computer Graphics, IEEE Transaction.
Borgefors, Distance Transformations in Digital Images, 1986, pp. 344-371, Computer Vision, Graphics, and Image Processing.
Breiman, Random Forests, Jan. 2001, pp. 5-32, Machine Learning.
Chawla et al., SMOTE: Synthetic Minority Over-Sampling Technique, Jun. 2002, pp. 321-357, Journal of Artifical Intelligence Research.
Chellappa et al., An Integrated System for Site Model Supported Monitoring of Transportation Activities in Aerial Images, 1996, pp. 275-304, Proceedings of the 1996 ARPA Image Understanding Workshop.
Elaksher et al., Automatic Generation of High-Quality Three-Dimensional Urban Buildings from Aerial Images, 2008, pp. 5-13, URISA Journal.
Elberink et al., Building Reconstruction by Target Based Graph Matching on Incomplete Laser Data: Analysis and Limitations, 2009, Sensors.
Elberink, Target Graph Matching for Building Reconstruction, 2009, Remote Sensing and Spatial Information Sciences.
Fischer et al., Extracting Buildings from Aerial Images Using Hierarchical Aggregation in 2D and 3D, Nov. 1998, pp. 185-203, vol. 72, No. 2, Computer Vision and Image Understanding.
Guennebaud et al., Algebraic Point Set Surfaces, 2007, vol. 26, ACM Transactions on Graphics (TOG).
Huang et al., Rule-Based Roof Plane Detection and Segmentation from Laser Point Clouds, Apr. 11-13, 2011, pp. 293-296, Joint Urban Remote Sensing Event (JURSE), Munich, Germany.
Lang et al., Surface Reconstruction of Man-Made Objects Using Polymorphic Mid-Level Features and Generic Scene Knowledge, 1996, pp. 415-420, International Archives of Photogrammetry and Remote Sensing.
Lin et al., Detection of Building Using Perceptual Grouping and Shadows, 1994, pp. 62-69, Computer Vision and Pattern Recognition.
Lin et al., Detection of Buildings from Monocular Images, Automatic Extraction of Man-Made Objects from Aerial and Space Images, 1995, pp. 125-134, Springer.
Milde et al., Building Reconstruction Using a Stuctural Description Based on a Formal Grammer, 2008, International Archives of Photogrammetry, Remote Sensing and Spatial Information Sciences.
Muller et al., Procedural Modeling of Buildings, 2006, ACM.
Osada et al., Shape Distributions, Oct. 2002, pp. 807-832, vol. 21, No. 4, ACM Transactions on Graphics (TOG).
Rusu et al., Persistent Point Feature Histograms for 3D Point Clouds, 2008, Intelligent Autonomous Systems.
Valero et al., Classification of Basic Roof Types Based on VHR Optical Data and Digital Elevation Model, 2008, pp. IV-149, vol. 4, Geoscience and Remote Sensing Symposium.
Verma et al., 3D Building Detection and Modeling from Aerial LIDAR Data, 2006, pp. 2213-2220, vol. 2, Computer Society Conference on Computer Vision and Pattern Recognition.
Vosselman et al., 3D Building Model Reconstruction from Point Clouds and Ground Plans, Oct. 2001, pp. 37-43, vol. XXXIV-3/W4, International Archives of Photogrammetry Remote Sensing and Spatial Information Sciences.
Wang et al., Gable Roof Description by Self-Avoiding Polygon, Computer Vision—ACCV, 2010, pp. 162-171, Springer.

* cited by examiner (a)

(b)

(c)

(b)

(a)

LEARNING SYNTHETIC MODELS FOR ROOF STYLE CLASSIFICATION USING POINT CLOUDS

CROSS-REFERENCE TO RELATED APPLICATIONS

This patent is related to and claims priority benefit of U.S. Provisional Application Ser. No. 61/841,630, filed Jul. 1, 2013, which is hereby incorporated by reference in its entirety.

FIELD

The following disclosure relates to systems, apparatuses, and methods for three-dimensional modeling of buildings, or more particularly, to systems, apparatuses, and methods for classifying and learning roof styles using three-dimensional point cloud data.

BACKGROUND

Along with development of the large area geographic information system (GIS) data collection devices, studies about building modeling (in particular, roof modeling and reconstruction) have shown a rising trend in the past several years. Realistic roof modeling has become increasingly popular in urban planning, navigation, and GIS. Two types of roof modeling include (1) mesh modeling and (2) roof style modeling. The mesh model preserves detailed low-level geometry, but may not be practical to render such models on certain devices. Additionally, no semantic information may be directly available using the mesh model.

On the other hand, roof style modeling enables realistic roof modeling at a semantic level and may be rendered more efficiently. Roof style modeling and reconstruction may use various data sources such as aerial imagery, ground level imagery, and light detection and ranging (LiDAR). Roof geometry structures and topologies may be analyzed, which may require complete and specific source data of the roof. In some examples, only a limited number of roof styles may be recognized and classified.

Aerial imagery, as one of the most popular data source of the large area geo-information, has drawn many scholars' attentions. Drawbacks of using aerial image come in several folds. At first, building image quality is highly depends on circumstances, detection of building and corresponding features can easily fail due to unexpected degradation such as occlusion or blur. Furthermore, building modeling through image only is more fragile due to lack of height information of building. Therefore, building and roof modeling is a continuing effort.

SUMMARY

Systems, apparatuses, and methods are provided for modeling roof styles using three-dimensional point cloud data. In one embodiment, the method comprises receiving point cloud data of a roof of a building. The method further comprises selecting roof data points from the point cloud data. The method further comprises calculating, using a processor, semantic type classifications for each roof data point of the selected roof data points. The method further comprises determining a roof style from the semantic type classifications.

Apparatuses are also provided for modeling roof styles. In one embodiment, the apparatus comprises at least one processor and at least one memory including computer program code for one or more programs, wherein the at least one memory and the computer program code configured to, with the at least one processor, cause the apparatus to at least perform: (1) receive point cloud data of a roof of a building; (2) select roof data points from the point cloud data; (3) calculate semantic type classifications for each roof data point of the selected roof data points; and (4) determine a roof style from the semantic type classifications.

BRIEF DESCRIPTION OF THE DRAWINGS

Exemplary embodiments are described herein with reference to the following drawings.

DETAILED DESCRIPTION

The following embodiments include systems, apparatuses, and methods for three-dimensional (3D) modeling of buildings, or more particularly, to systems, apparatuses, and methods for three-dimensional roof modeling using three-dimensional point cloud data.

Figure 1:
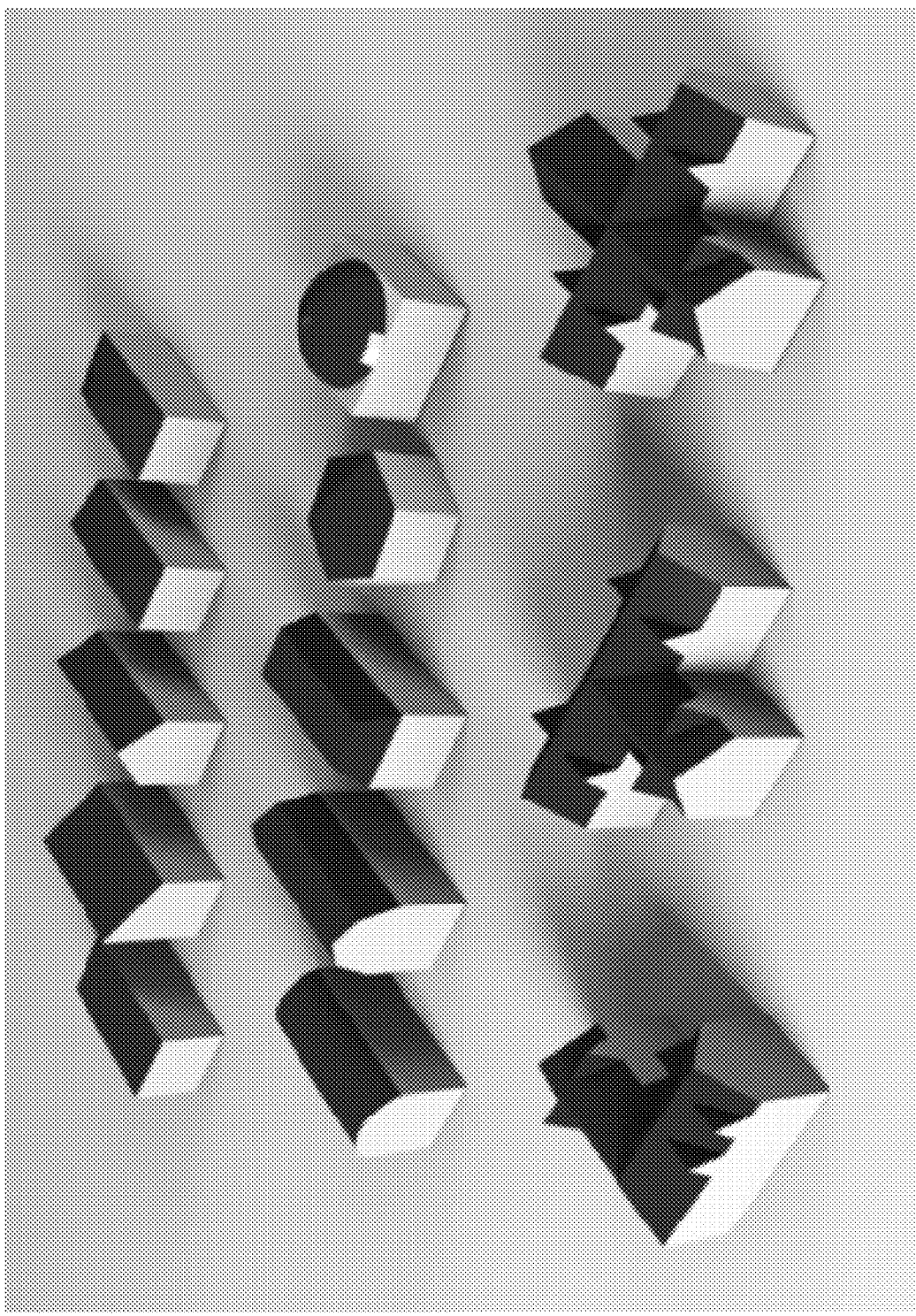
FIG. 1 illustrates various examples of roof styles capable of recognition. From top down and left to right, the roof styles illustrated are: flat, shed, gable, hip, pyramid, curved, gambrel, mansard, hex, dome, L-union, T-union, and X-union.

In certain embodiments, the systems, methods, and apparatuses for the roof style classification are based on machine learning using 3D point cloud data of the building roofs. The machine learning may be capable of recognizing multiple styles of roofs (e.g., at least 5 styles, at least 10 styles, at least 15 styles, at least 20 styles, etc.) presented in the current data sets. For example, roof styles that may be recognized include flat, shed, gable, hip, pyramid, curved, gambrel, hex, dome, L-union, T-union, and X-union-type roofs (as depicted in FIG. 1).

Different styles of roof distinguish with each other either by unique semantic types (i.e., point type classification) or different proportion of each semantic type (i.e., roof style classification). The embodiments may involve (1) recognizing each roof point's "semantic type" or "semantic type classification" (i.e., a description of the location of the point on a roof), and/or (2) analyzing the number of points for each semantic type in the roof. Based on a distribution histogram or database of each type of points, the classifier may accurately classify roof styles with different degrees of degradation.

Figure 2:
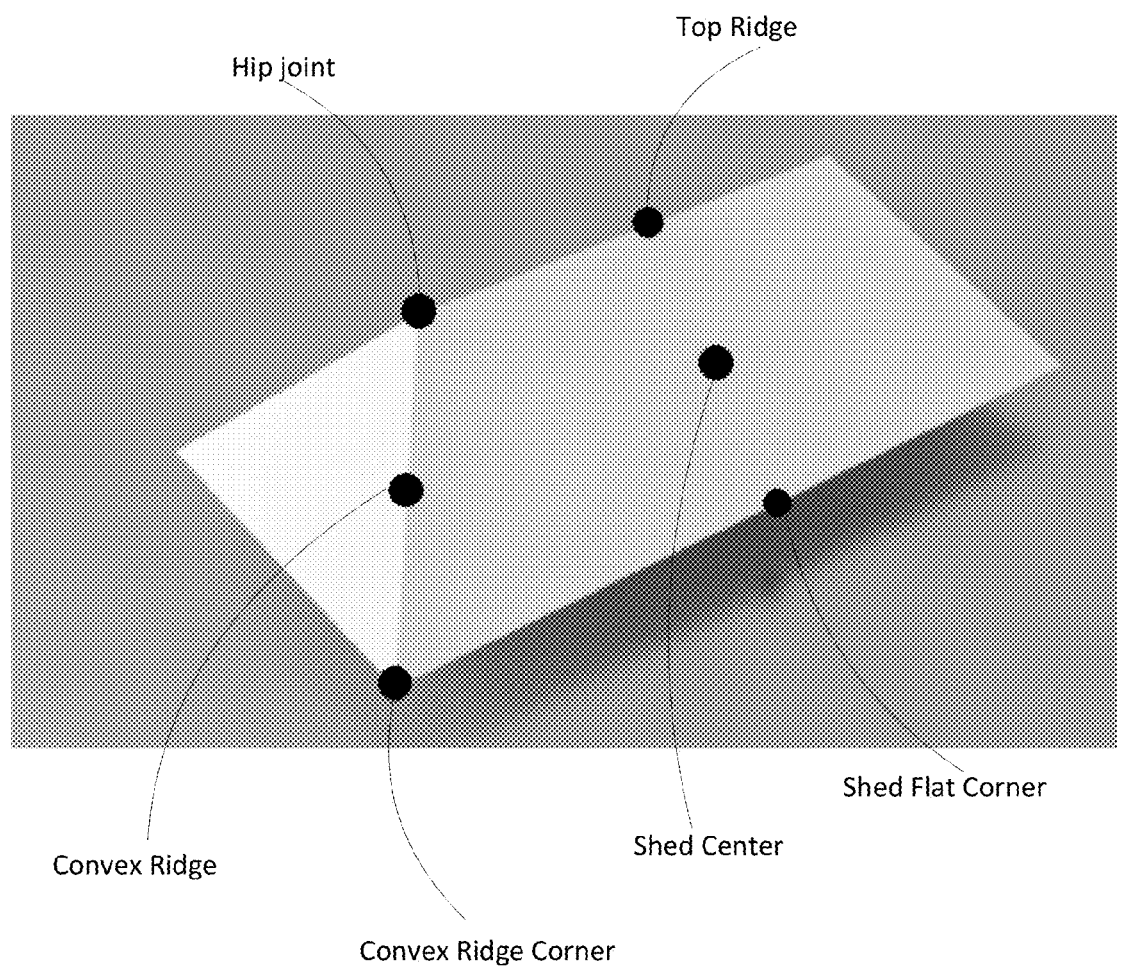
FIG. 2 illustrates an example of various points of a hip roof, and the semantic types of the various points.
Figure 3:
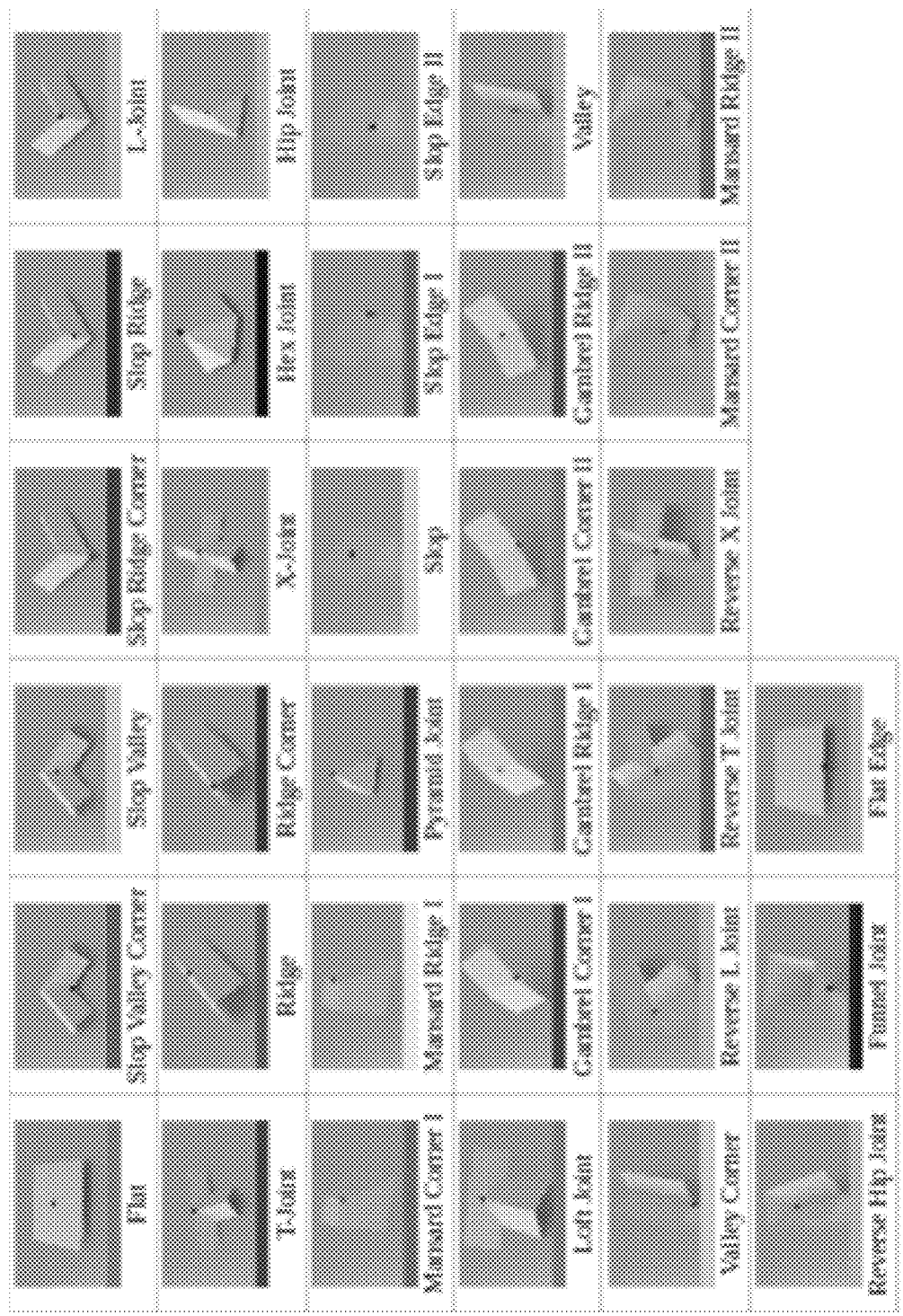
FIG. 3 illustrates thirty-three different semantic types, where the dot on each roof represents a location identified with the semantic type.

In some embodiments, a database or training set of the semantic type roof points may be developed from synthetic and/or real roof models. In certain embodiments, the database or training set may be updated to include the calculated roof type being analyzed. In certain embodiments, categorizing the different semantic types may include (1) being as distinguishable as possible and, at the same time, (2) being as general as possible so that each semantic type may be both descriptive and general enough to represent points with similar structure. For example, roofs usually and mainly are composed of semantic types such as: ridge, valley, edge, joint, corner, and surface. As depicted in FIG. 2, semantic types may include a top ridge, a hip joint, a convex ridge, a convex ridge corner, a shed center, and a shed flat edge. In one embodiment described herein, thirty-three (33) different semantic types are defined, and roof points are classified to these 33 categories, depicted in FIG. 3, using a point type classifier.

Additionally, dozens of basic roof structures are created, from which key points of roof basic parts can be extracted. By modifying the configuration such as height, dihedral angle with ground and so on, a training set or database may be generated with up to or more than one hundred thousand synthetic models. In certain embodiments, the synthetic models are produced as triangle mesh and are subdivided to simulate point cloud, to keep roof shape untouched. Midpoint subdivision with uniform sampling rate may be applied to the entire synthetic model and no smoothing may be conducted on the resulting subdivision surface.

In certain embodiments, an unbiased and robust classifier may be developed based on a machine learning algorithm (e.g., random forest) using a training set or database. In some embodiments, the accuracy of the systems, methods, and apparatuses for the machine learning algorithm may exceed 50%, 60%, 70%, 80%, 90%, or 95% accuracy. In other words, the embodiments do not require shape fitting or roof topology detection.

Recognizing roof styles from semantic parts may be very useful in large scale roof modeling task, because there are cases where building roofs are partially occluded by other objects, and traditional geometry detection based methods fail to classify the style. In other words, in certain embodiments, as long as unique semantic parts of roof are visible and extracted from point cloud data, the roof style may be classified.

In certain embodiments, systems, methods, and apparatuses for roof style classification comprise one or more of the following acts: (1) receiving and extracting/selecting point cloud data of a building, (2) processing (e.g., normalizing) the selected roof data points from the point cloud data, (3) calculating semantic type classifications for each roof data point, (4) determining a roof style from the semantic type classifications, and (5) modeling or developing a synthetic building image from the determined roof style for the selected point cloud data.

Receiving and Extracting Point Cloud Data

In certain embodiments, the roof style process includes extracting and analyzing point cloud data of a building. In certain embodiments, the point cloud or "depth map" data is acquired using 3D optical distancing systems or intensity-based scanning techniques, such as those described in U.S. Pat. No. 8,553,942, herein incorporated by reference in its entirety. In certain embodiments, depth maps or point cloud data are collected using a Light Detection and Ranging (LIDAR) system. LIDAR, also known as LiDAR, Lidar, or other similar representations, may also be referred to as three-dimensional laser scanning or an optical distancing system, which employs one or more lasers or "cameras" to collect data points representing an area, such as an area about a road or walkway. Software generates the depth map or point cloud based on the measured distance, the locations of the optical distancing system, which may be on a moving platform such as a car or plane, and the angle of the laser. Other optical distancing systems include a stereoscopic camera, a time of flight infrared camera, and a structured light device.

A LIDAR device collects and gathers data points in a point cloud in which each data point corresponds to a local coordinate, such as (x, y, z), and is either on or off. Alternatively, the LIDAR data may be a grayscale point cloud including an intensity (indicating reflectivity) for each data point, in a predetermined range of values (e.g., 0 to 255, 0 to 65536) with black at one end of the range and white at the other. The point cloud may be stored in ASCII or LIDAR exchange format (e.g., the American Society for Photogrammetry and Remote Sensing (ASPRS) .LAS file format). The one or more lasers may be in a near infrared spectrum (such as about 700 nm to about 5000 nm or about 800 nm to about 2500 nm) or other light spectrum.

In some embodiments, a LIDAR data acquisition system may be attached or otherwise integrated with a vehicle. There may also be a positioning system integrated with the LIDAR vehicular system such as a GPS to provide a base reference or "ground truth" for the data acquired by the LIDAR system. The mobility of a vehicular system may facilitate acquiring data across a large geographic area using established positions for reference and integration of the acquired data into a point cloud representing the geographic area.

Using the LIDAR data, a plurality of points within the data may be processed and analyzed. The roof style classification algorithm may be based on detection of various types of semantic points (e.g., a top ridge point, a hip joint point, etc.). Based on extraction, processing, and analysis of a number of data points from the point cloud data, it may be possible for a finite combination or set of semantic points to describe a type of roof structure.

Processing the Selected Point Cloud Data

Following extraction of the point cloud data of a building and its roof, the point cloud data may be processed to normalize the real roof data and/or resample the roof point cloud with synthetic roof model data. Normalizing the point cloud data may keep the size and point cloud sampling rate with synthetic roof model data as similar as possible so that the size of the real data's semantic types compared with the size of a synthetic model may be kept as similar as possible. In other words, the extracted real data may be normalized with synthetic data in order to provide a more accurate side-by-side comparison between the real and synthetic data to which the real data is being modeled.

In certain embodiments, roof data may be normalized by defining the size of sampled roof as the radius of largest inscribed circle of the roof's footprint. By taking the radius of largest inscribed circle, the normalization may align the primary part of real roof with the size of synthetic model if real roof does not contain any big branch. Additionally, even if real roof data has many big branches, the primary part of roof that has the biggest branch may be aligned.

In certain embodiments, the radius of the inscribed circle is determined by creating a building footprint, mapping points to a two-dimensional (2D) binary footprint image in which a pixel will be occupied if there is any point falling into the area of the pixel. Otherwise, the pixel is empty and will be colored as white. Morphology operation may be used to fill up small gaps within the footprint. Edge imaging of the footprint may then be generated. The center of inscribed circle may be obtained by computing distance transform of edge image using Euclidean distance. The pixel within the roof area with the largest distance is marked as the center of the largest inscribed circle.

Figure 4:
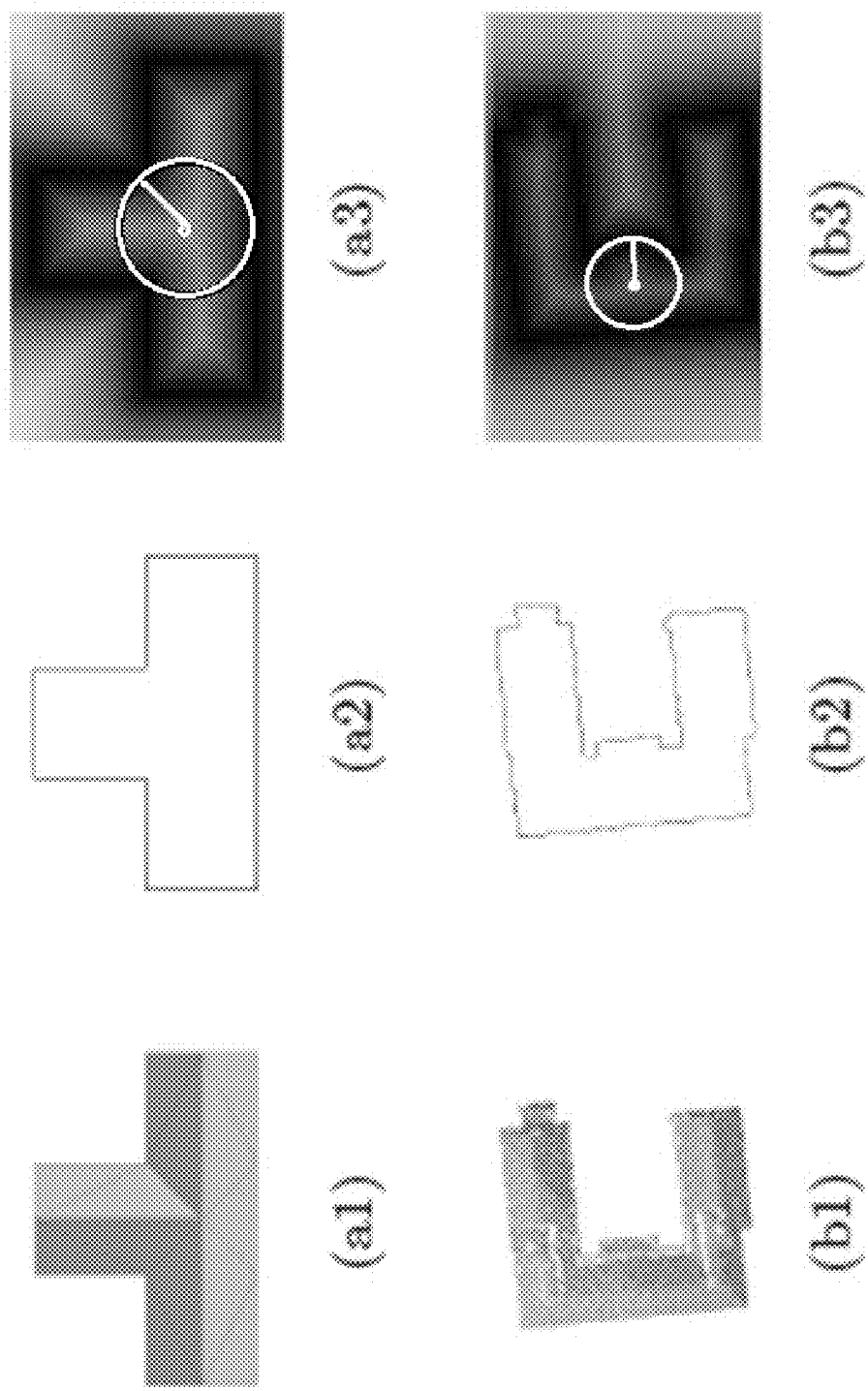
FIG. 4 illustrates an example of a method for determining the radius of an inscribed circle for both synthetic roof data (a1, a2, a3) and real roof data (b1, b2, b3). For both synthetic and real roof data, the center, radius, and largest inscribed circle are depicted in a3 and b3.

Non-limiting examples of both synthetic model data (a1, a2, a3) and real roof data (b1, b2, b3) are depicted in FIG. 4, with the inscribed circle, center, and radius. In one embodiment, a uniform radius r* (e.g., 5 meters) is used for each synthetic model regardless of model type. After determining the inscribed circle radius r of the real roof from the extracted point cloud data, the real roof image data is normalized by scaling it using scale factor δ, which is computed as:

$$\delta = \frac{r^*}{r} \quad (1)$$

In certain embodiments, sampling problems in the point cloud data may need to be addressed. For example, aerial LIDAR roof data may have a lower sampling rate than a synthetic roof model. Therefore, there may be a need to increase the point density by up-sampling the point cloud data.

In some embodiments, the point cloud data may be fused together from data generated by different scanners, so there may be a noticeable scanning pattern in the point cloud data. These scanning patterns, if existing, may result in an unexpected sudden change of point features within small area. This point cloud sampling problem may be resolved by modifying point cloud directly. For example, this modification of the point cloud data may work by making use of up-sampling and down-sampling algorithm to resample target roof data to meet required point cloud resolution.

On a mesh structure, resolution is measured by averaging the length of the edges, where shorter edges are given a higher resolution. In some embodiments, resolution for a specific point p may be computed as the average distance from the specific point p to all of its neighboring points within a bounding sphere. In other embodiments, resolution may be determined by computing point density within a unit bounding area, and locally, the roof presents a flat surface. For example, the point cloud may include points $P=p_1, p_2, \ldots, p_n$. The density within unit area for point $p_i$ can be calculated as:

$$\varphi_i = \frac{|N_i|}{\pi d^2} \quad (2)$$

wherein $N_i$ denotes neighbors within a bounding circle centered at $p_i$, and for all points in $N_i$, the distance from center $p_i$ to the farthest points is d.

Since density $\varphi_i$ computed in Equation 2 is with respect to unit area, the unit area circle may be mapped to a unit area square, wherein the points are evenly and regularly distributed within the unit square. The number of points on each edge of square is $\sqrt{\varphi_i}$ and the length of the interval between two closest points on edge as resolution measurement ($\beta_i$) at the particular point $p_i$, the expression of which is given by following equation:

$$\beta_i = \frac{1}{\sqrt{\varphi_i} - 1} \quad \text{for } \varphi > 1, \quad (3)$$
$$\beta_i = 0 \quad \text{for } \varphi \leq 1$$

By averaging the resolution measurement of all points (n), the resolution of the roof point cloud is given by:

$$\beta = \sum_{i=1}^{n} \frac{\beta_i}{n} \quad (4)$$

The averaged roof resolution may be used as a parameter in resampling framework. The resampling framework may super-sample roof data to a resolution higher than the target resolution, followed by down-sampling the data, which will make the point cloud data meet a required resolution. The super-sampling method may be based on mesh reconstructed from point cloud. A number of reconstruction algorithms may be chosen for this process. For example, a Ball-Pivoting Algorithm (BPA) may be used since BPA only requires the user to provide a radius of a rolling ball as a parameter, and it is theoretically guaranteed to reconstruct a bounded mesh homeomorphic to the original manifold. In a Ball-Pivoting Algorithm, a ball with radius ρ rolls on the point cloud surface and pivots around an edge of current seed triangle that three points will form a triangle if the ball touches them without containing any other points. All touchable edges through the seed triangle will be tried as the ball rolls over them. The process then starts from another seed triangle until all points have been used.

In one embodiment, a ball with radius ρ=1.5β may be used. The reconstructed mesh is labeled as M=(V, E, F). Midpoint subdivision may be used to super-sample mesh M, any edge $e_i \in E$ with length larger than β* may be subdivided to generate a mesh M' with approximate resolution of β*/2.

Figure 5:
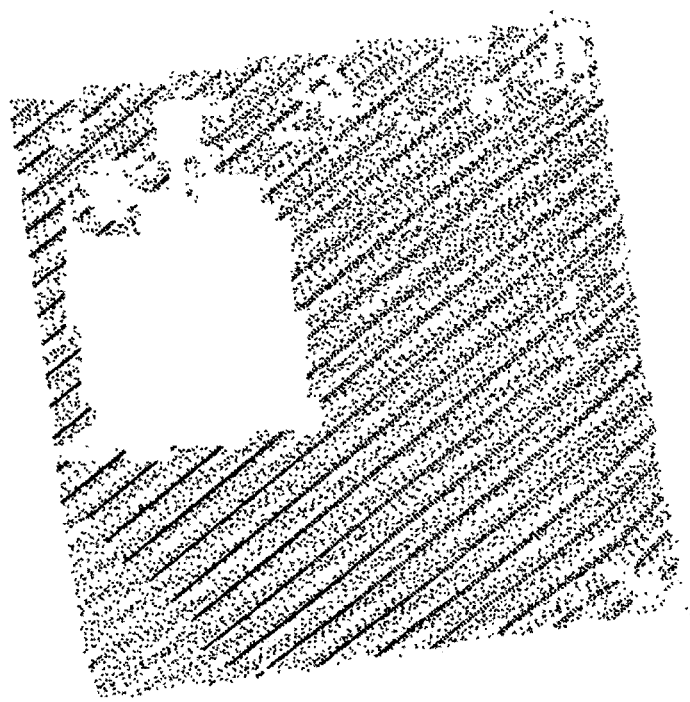
FIG. 5 illustrates an example of roof point cloud data without resampling (a) and with resampling (b).
Figure 5:
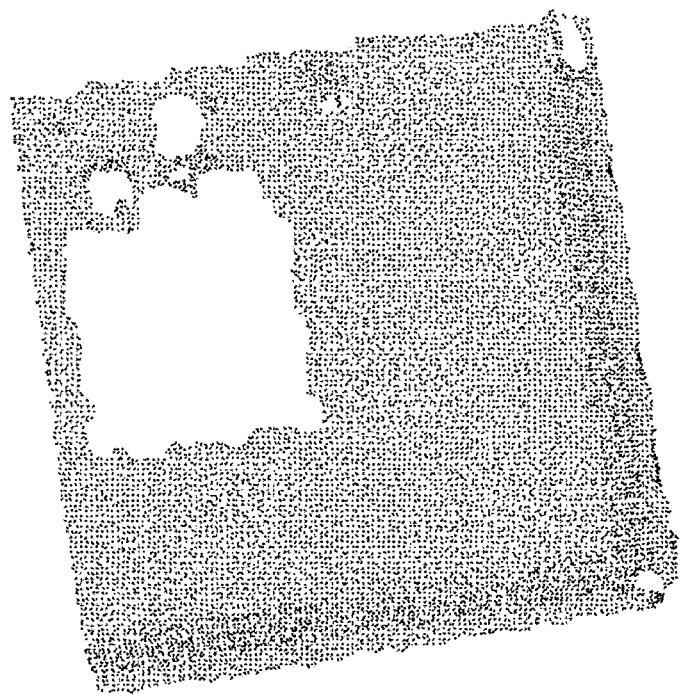

The down-sampling method may be based on regularly spacing an entire roof point cloud using an octree, by given required resolution β*=0:3, wherein the octree is constructed whose leaf node cell's length is β*. By taking closest point to cell center, the roof is down-sampled to target resolution. An example of roof data before and after resampling is shown in FIG. 5. It may be observed that following resampling, a strip shaped scanning pattern in the original point cloud data shown in (a) may be eliminated. The resulting, resampled point cloud data is more even in (b).

Determining Point Feature Vectors

Following processing of the point cloud data, the processed, normalized point cloud data may be analyzed. In certain embodiments, point feature vectors of the normalized point cloud data may be computed. The point feature vectors may include shape features and/or contextual semantic features.

In some embodiments, the feature is determined in order to describe the roof shape within a bounding area. Accordingly, information of neighboring points may be considered when the feature is computed. The point feature vectors may use a specific direction as a reference direction.

Since it is hardly to known in advance which feature will be useful for classification, the feature vectors may be constructed using as many informative features as possible. In view of a fact that Random Forest can automatically perform feature selection, each node of the random tree may be required to select a feature from limited feature subset. Based on this mechanism, it is possible to add other features besides the ones used in this implementation. Adding more informative features may not lead to less accurate results. Keeping the feature computation consistent between real roof data and synthetic model data is important, such as careful selection of range of neighborhood, taking care of the sampling difference between two data, and noise in real roof data.

Shape Features

In certain embodiments, for each point $p_i$ of roof point cloud, a 141 dimensional feature vector may be computed ($S_i$) to be used in a first point type classifier. Given a normalized roof point cloud P, resolution $\beta_i$ of each point is updated, and the features are computed based on a specific point ($p_i$) and its neighboring points ($N_i$) within a bounding sphere. A bounding sphere with fixed radius (e.g., $\mu^*=1:0$ meter) is applied to a synthetic model training set feature vectors computation. Even though roof normalization and point cloud resampling have been performed, to keep consistency about the number of neighboring points in the feature computation with the synthetic model, a bounding sphere radius ($\mu_i$) at point $p_i$ of real data is determined by expression in below:

$$\mu_i = \frac{\beta_i}{\beta^*} \quad (5)$$

In certain embodiments, Eigen vectors are computed for the extracted and normalized/resampled point cloud data points. Eigen vectors may be computed: $\lambda_1$; $\lambda_2$; $\lambda_3$ of covariance matrix of neighboring points $N_i$ centered at $p_i$. Additional features for $p_i$ may also be calculated (e.g., $\lambda_1$; $\lambda_2$; $\lambda_3$; $\lambda_3 - \lambda_2$; $\lambda_2 - \lambda_1$; $\lambda_1/(\lambda_1+\lambda_2+\lambda_3)$; $\lambda_2/(\lambda_1+\lambda_2+\lambda_3)$; and $\lambda_3/(\lambda_1+\lambda_2+\lambda_3)$), yielding 8 features in total.

In other embodiments, a Point Feature Histogram (PFH) may be computed for the point cloud data. For example, the PFH may be determined given point $p_i$ and one of its neighboring points $p_j \in N_i$ and their normals $n_i$ and $n_j$, wherein a point having the smaller angle between the associate normal and the vector connecting the two points is selected as source point $p_s$ and another point is $p_t$. A Darboux frame origin at $p_s$ is defined as: $u=n_s$, $v=(p_t-p_x)\times u$, and $w=u\times v$. Three geometric features may be computed:

$f_1=v^*n_t$ $f_2=u^*(p_t-p_s)/d$ $f_3=a\tan(w^*n_t,u^*n_t)$ where d is the distance between two points $p_t$ and $p_s$. Taking into account computation efficiency, the number of subdivisions of the feature's range may be set to be 3 which resulting a $3^3=27$ bins histogram.

In yet other embodiments, Shape Distribution Features (SD) may be computed for the point cloud data. Shape distribution measures global geometric properties of an object by represent object's feature as probability distributions. Since shape distribution is invariant to translation, rotation, and scale, and is informative in matching objects, four features based on distribution of point's features may be implemented for point $p_i$ and its sphere bounded neighboring points $N_i$.

Figure 6:
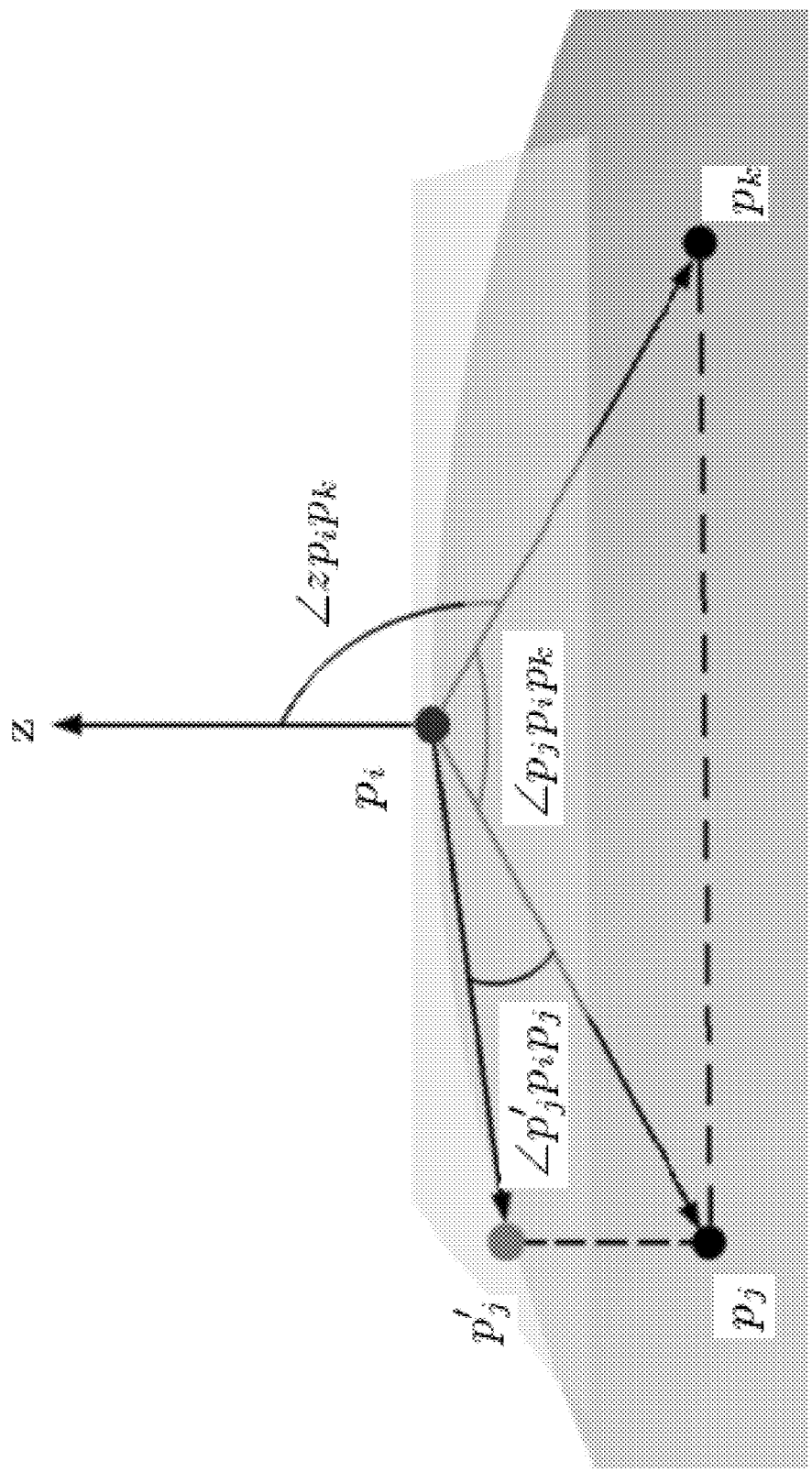
FIG. 6 illustrates an example of shape distribution features for a selected point $(p_i)$.

One feature (A2) measures the angle between two vectors composed of random two neighbors $p_j$, $p_k \in N_i$ and $p_i$, shown as angle $p_j p_i p_k$ in FIG. 6. The A2 feature may be computed for all pairs of random two neighbors in $N_i$.

A second feature (Az) measures the angle between the z direction and a vector pointing from $p_i$ to a neighboring point $p_k$, shown as angle $zp_i p_k$ in FIG. 6. Each neighbor of $p_i$ may be used to compute this feature, respectively.

A third feature (D2) measures the distance between two random neighbors of $p_i$, an example is shown as $\|p_j p_k\|$ in FIG. 6. D2 may be computed for each pair of random neighboring points in $N_i$.

A fourth feature (Dt) measures the angle between tangent plane of $p_i$ and a vector pointing from $p_i$ to a neighboring point $p_j$, shown as angle $p'_j p_i p_j$ in FIG. 6, where $p'_j$ is the projection of $p_j$ on a tangent plane. Neighboring points of $p_i$ may also be used to compute this feature, respectively.

According to possible range of the above four features, a histogram with ten (10) bins may be generated using these features. In total, forty (40) features may be generated for these kinds of shape distribution features.

In yet other embodiments, Spin Images may be computed for the point cloud data. For example, within the bounding sphere, a spin image with 6(width)×11(height) dimensions may be generated using the z direction as the spinning axis.

Figure 7:
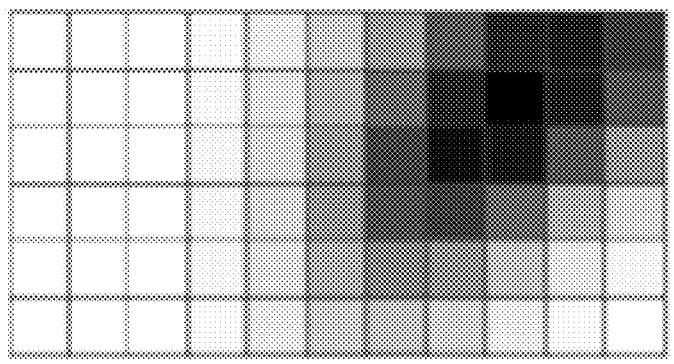
FIG. 7 illustrates an example of using convolution of Gaussian distribution on a spin image.
Figure 7:
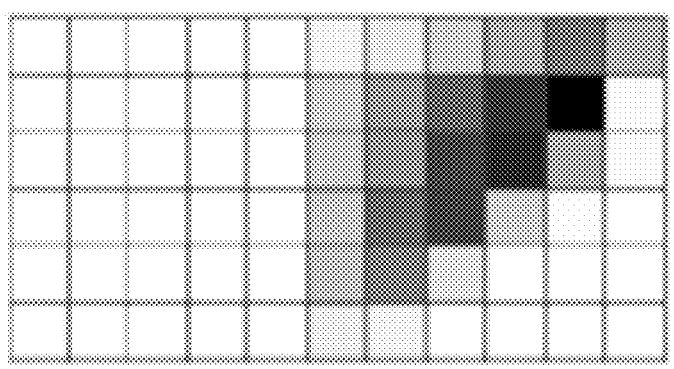
Figure 7:
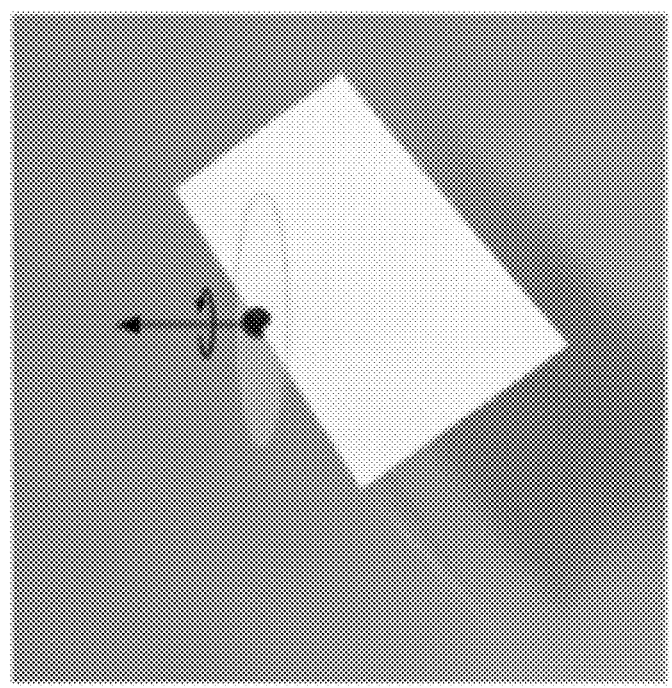

In certain embodiments, for all features except the Eigen feature, the feature value of each entry of a feature vector may be spread to its adjacent feature entries using convolution of a Gaussian distribution. For example, a 3×3 two-dimensional Gaussian kernel may be applied to a spin image, and a size 3 one-dimensional Gaussian kernel may be used to convolve with the Point Feature Histogram and Shape Distribution Features. An example of result of running this convolution is depicted in FIG. 7. In (a), the dot shows the location where the spin image feature is computed. In (b), the spin image is depicted without convolution, and in (c), the spin image is depicted after applying convolution.

Contextual Semantic Features

To identify the semantic type of a selected roof point, not only may shape features be measured, but also contextual semantic features for interest points may be taken into account. Contextual semantic features may be used to construct an iterative classifier. The construction of contextual semantic features may be based on a point type fuzzy labeling (described in greater detail below) generated by the last iteration. Initial label possibilities of points are generated by classifier trained on shape features.

In one embodiment, 33 different semantic types are defined. To provide the distribution of these 33 semantic types, a feature vector $C_i^t$, $t \geq 0$ with 33 dimensions used to denote the contextual semantic feature vector for point $p_i$ in the $t^{th}$ iteration and $C_i^t[j]$ may be used to denote the $j^{th}$ feature in the feature vector. So, in the $t^{th}$ iteration, for point $p_i$, the proportion of each type of semantic points in its neighborhood $N_i$ is computed, and then the computation at the $j^{th}$ feature of $C_i^t$ is given by following equations:

$C_i^t[j]=\Sigma_{p_k \in N}p(l_j|S_k)$ if $t=1$, $C_i^t[j]=\Sigma_{p_k \in N}p(l_j|S_k,C_k^{t-1})$ if $t>1$, (6)

where label $l_j$ refers to the point's semantic label and $S_k$ is a feature vector.

Point Type Classification

In certain embodiments, based on the point feature vectors determined, a machine learning algorithm may be used to determine the point type classification. In one embodiment, Random Forest may be selected to determine the point type classification. Random Forest may be configured by setting two parameters (e.g., the number of trees $\theta_0$ and the number of features $\theta_1$ randomly chosen at each tree node). In one example, given the number $\in$ of all features, the following are set: $\theta_0=100$ and $\theta_1=\sqrt{\in}$.

Given point set $P=p_1, p_2, \ldots, p_n$ and a set of point semantics labels $L=l_1, l_2, \ldots, l_{33}$, two point type classifiers may be developed. For both point type classifiers, a "fuzzy labeling" may be employed. The selection of fuzzy labeling rather than giving an exact label lies in several facts. First, in some roof structures, there are points which are close to several semantic roof parts and it may be hard and inaccurate to categorize this point as any one of these semantic parts. In addition, sometimes, because of degradation such as noise and erosion on point cloud surface, a point may get a wrong label by majority vote, and in this case, a fuzzy labeling could spread the point's membership to other classifications and compensate for the loss of accuracy to some extent. Therefore, instead of giving an exact label $l_j$ to point $p_i$, the record's probability belonging to each class is saved, denoted as: $P(l_j|X_i)$, and $1=\Sigma_{j=1}^{33} P(l_j|X_i)$, where $X_i$ is a feature vector.

The first point type classifier recognizes the semantic type of each roof point and generates output as a probability of membership to each of the point type classes (e.g., the 33 different point type classes).

The second point classifier is constructed by iteratively learning shape features and contextual semantics features of the synthetic data. For example, in the $t^{th}$ iteration, a histogram $H_t=h_1, h_2, \ldots, h_{33}$ may be used to save the summation of possibility of all points being classified as each semantic type. Therefore, for point cloud $P=p_1, p_2, \ldots, p_n$, each bin $h_j$ of $H_t$ may be computed as:

$$h_j^t = \Sigma_{i=1}^n \rho(l_j|S_i, C_i^{t-1}) \quad (7)$$

where $1 \leq j \leq 33$, in some embodiments.

Convergence criteria may be given by comparing the difference of histogram H in two adjacent iterations. Two criteria may be employed. First, the difference between corresponding bins is checked in two iterations:

$$\Delta d_j = |h_j^t - h_j^{t-1}| \quad (8)$$

where $1 \leq j \leq 33$, in some embodiments.

Second, the overall average change between two histograms may be checked:

$$\overline{d} = \sum_{i=1}^{33} \frac{\Delta d_j}{33} \quad (9)$$

In certain embodiments, $\Delta d_j=5\%$ and $\overline{d}=2\%$ may be used as convergence criteria for both training and testing. In the training stage, the final model may be generated when more than 95% of training data meets the convergence criteria. In some examples, the time for convergence is fast and most of data can converge within six iterations.

Roof Type Classification

In certain embodiments, in addition to, or independent of determining a particular roof type through point type classification, the determination of a particular roof style may be based on an overall distribution of semantic parts within the roof style. In other words, each roof style may be distinguishable from the other roof styles based upon having a different proportion of each kind of semantic part type (e.g., one particular roof style may have a distribution of 10-15% of a first semantic part type, 2-3% of a second semantic part type, 20-30% of a third semantic part type). For example, a flat roof may have more flat points than a gable roof, and a hip roof may have more convex ridge points than a gable roof.

In certain embodiments, a database may be generated for a number of roof types from a number of analyzed real buildings, where the database contains the average proportion or distribution of each semantic roof point for each roof type. In some embodiments, the database may be updated or revised based on the collection and analysis of additional roof data, including roof data processed through analysis of point cloud data herein. The number of different roof types may also be revised to include new roof type structures distinguishable from the existing roof types classified in the database. In fact, by using the proposed framework, the roof type classifier may potentially classify as many roof types as possible so long as enough number of roofs under each type may be trained.

In certain embodiments, roof type classification may be determined using a machine learning algorithm such as Random Forest, Decision Trees, Naïve Bayes, Neural networks, etc. In one particular embodiment, the roof type classification may be determined using Random Forest. The algorithm may be trained using real roof data instead of synthetic data, as it may be difficult to create a synthetic model repository which fully covers and mimics all roof shapes in the real world considering that real roofs vary in shape, combination, size, and so on. Furthermore, in certain embodiments, the roof type classifier algorithm may be developed based on data coming from same data source (as data obtained from different devices, location, and time may contain different degradation).

In one example, a roof type classifier inputs a histogram of semantic roof points of a roof, and the machine learning algorithm classifies the sampled roof data into a particular roof category (e.g., flat, shed, gable, hip, pyramid, curved, gambrel, mansard, hex, dome, L-union, T-union, X-union).

It is noted that the proportions of different roof types may be highly imbalanced where roof types such as: flat, gable, and hip are the dominant types in every data set (which is quite understandable from point of view of how real roof is built). Learning from highly imbalanced data may give higher weight to data with majority labels, and as a result, a biased model may be generated. Therefore, in certain embodiments, sampling strategies may be employed by up-sampling minority or down-sampling majority data. Because the data is highly imbalanced, down-sampling majority items to match number of minority may reduce the number of data used as training set. Therefore, in certain embodiments, an up-sampling algorithm is used. The up-sampling algorithm may be a Synthetic Minority Oversampling TEchnique (or "SMOTE"). SMOTE may over-sample minority class by creating synthetic examples in feature space of the data. To over sample a data item, a number of nearest neighbors (k) in feature space are chosen, and based on over-sampling rate, it randomly choose data from these k neighbors, and a random weight interpolation is employed to create new data item. By doing this, SMOTE may extend the boundary of minority class on the decision regions in feature space, which may result in a larger weight to the minority class, so as to decrease the bias in original learning model.

Modeling a Synthetic Building Image

In certain embodiments, when the roof style of a building is determined, a reconstructed, synthetic roof/building model may be generated to match the calculated roof style. The synthetic model may be reconstructed as a two-dimensional or three-dimensional model image. The reconstruction process may be conducted using a grammar based procedure, for example.

The reconstructed, synthetic roof may be developed for mapping software. This process may provide global consistency and suitability for large scale map making (e.g., 3D map making). The roof modeling and classification framework embodiments may also be useful where efficient data transmission and fast building rendering is desired for map and navigation applications based on mobile devices. For example, such reconstructed, synthetic architecture may be applied to advanced mobile devices and greatly reduce data transmission through wireless network. A back end server may be configured to send the building footprint and roof style to the front end (e.g., mobile device). Once data is received, the mobile device may be configured for the computing processing related to reconstruction and rendering work.

Experimental Results and Uses of Roof Type Learning Machine

The embodiments disclosed herein have been tested on two different data sets. The first data set ("Data Set 1") is employed from United States Geological Survey (USGS) digital coast project, where an area of georeferenced aerial LiDAR covering San Francisco was tested. Another data set ("Data Set 2") used collected aerial point cloud data of Chicago generated from mesh structure, which was reconstructed from aerial images.

These two data sets are different from each other in terms of degradation existing in the point cloud data. However, as the data in both data sets are provided with ground truth labels, degradation of roof data may be consistent within each data set, which confirms the accuracy of generating roof type classifier based on each data set.

All buildings in the data set will be labeled as one of: curve, done, at, gable, gambrel, hex, hip, Mansard, pyramid, and unknown. Both satellite imagery and roof point cloud were referred when labeling the ground truth, and the unknown label was given to data when either point cloud data was very poor or the roof type could not be recognized as one of candidates in the repository. Further, when roof types combine together within a single building, the label is given to the primary roof of the combination.

The point type classifier was tested using 10 folds cross-validation on synthetic models themselves, and for all of folds that is tested, 100% overall classification accuracy may be achieved.

For both data sets, the data may be evenly divided into two sets, one used for training and another part for testing. SMOTE resampling is applied to the training set and an evenly distributed training set was created by matching every roof type with majority roof type.

For both data sets, the classifier achieved above 90% high accuracy. Accuracy of first data set is 93% and was a little better than second data set whose accuracy is 91.4%. An evaluation on Data Set 2 includes the matrix in Table 1 and per class accuracy details in Table 2.

TABLE 1

Confusion Matrix for Data Set 2

| ACTUAL | PREDICT | | | | | | | | | | |
|---|---|---|---|---|---|---|---|---|---|---|---|
| | a | b | c | d | e | f | g | h | i | j | k |
| a | 158 | 0 | 0 | 0 | 0 | 0 | 0 | 0 | 0 | 0 | 0 |
| b | 0 | 28 | 0 | 0 | 0 | 0 | 0 | 0 | 0 | 0 | 0 |
| c | 0 | 0 | 140 | 25 | 0 | 1 | 2 | 1 | 0 | 0 | 4 |
| d | 0 | 0 | 10 | 75 | 0 | 0 | 0 | 0 | 0 | 0 | 0 |
| e | 0 | 0 | 0 | 0 | 32 | 0 | 0 | 0 | 0 | 0 | 0 |
| f | 0 | 0 | 0 | 0 | 0 | 47 | 0 | 0 | 0 | 0 | 0 |
| g | 0 | 0 | 0 | 1 | 0 | 0 | 31 | 0 | 0 | 0 | 0 |
| h | 0 | 0 | 0 | 0 | 0 | 0 | 0 | 32 | 0 | 0 | 0 |
| i | 0 | 0 | 0 | 0 | 0 | 0 | 0 | 0 | 0 | 0 | 0 |
| j | 0 | 0 | 0 | 0 | 0 | 0 | 0 | 0 | 0 | 0 | 0 |
| k | 0 | 0 | 3 | 2 | 0 | 0 | 3 | 0 | 0 | 0 | 46 | a = plat; b = shed; c = gable; d = hip; e = hex; f = pyramid; g = mansard; h = curve; i = gambrel; j = dome; k = unknown

TABLE 2

Accuracy Details for Data Set 2

| CLASS | TP | FP | Precision | Recall | F-Measure | PRC Area |
|---|---|---|---|---|---|---|
| Flat | 0.982 | 0.016 | 0.952 | 0.982 | 0.967 | 0.990 |
| Shed | 1.000 | 0.000 | 1.000 | 1.000 | 1.000 | 1.000 |
| Gable | 0.838 | 0.021 | 0.935 | 0.838 | 0.884 | 0.939 |
| Hip | 0.918 | 0.041 | 0.772 | 0.918 | 0.839 | 0.870 |
| Hex | 1.000 | 0.000 | 1.000 | 1.000 | 0.989 | 1.000 |
| Pyramid | 1.000 | 0.002 | 0.979 | 1.000 | 0.989 | 1.000 |
| Mansard | 1.000 | 0.008 | 0.865 | 1.000 | 0.928 | 0.999 |
| Curved | 1.000 | 0.002 | 0.970 | 1.000 | 0.985 | 1.000 |
| Gambrel | 0.000 | 0.000 | 0.000 | 0.000 | 0.000 | NA |
| Dome | 0.000 | 0.000 | 0.000 | 0.000 | 0.000 | NA |
| Unknown | 0.700 | 0.014 | 0.840 | 0.700 | 0.764 | 0.875 |
| Average | 0.914 | 0.017 | 0.917 | 0.914 | 0.913 | 0.953 |

It may be observed from these two tables that the method performs well on classifying a majority of roof types. Error may exist in confusion between hip and gable roofs, which is understandable, because these two roofs are very similar in their primary shapes, and the roofs only differentiate with each other by a different ridge and corner type at the end of the roof structure.

In some embodiments, recognition and classification of an unknown roof type may be challenging, since there is no regular pattern that can be used to describe roofs in this group. Results given by the classifier are still acceptable, though, because many misclassifications of unknown roofs may be distributed in the most common roof types. This is acceptable and may not make model looks strange in large are building modeling task.

The embodiments may also keep track of the result under increasing number of training data, the same testing set is used to generate this measurement. The result of each roof type as F-Measure or F-Score (F) is provided below:

$$F = 2 * \frac{Precision * Recall}{Precision + Recall} \qquad (10)$$

Figure 8:
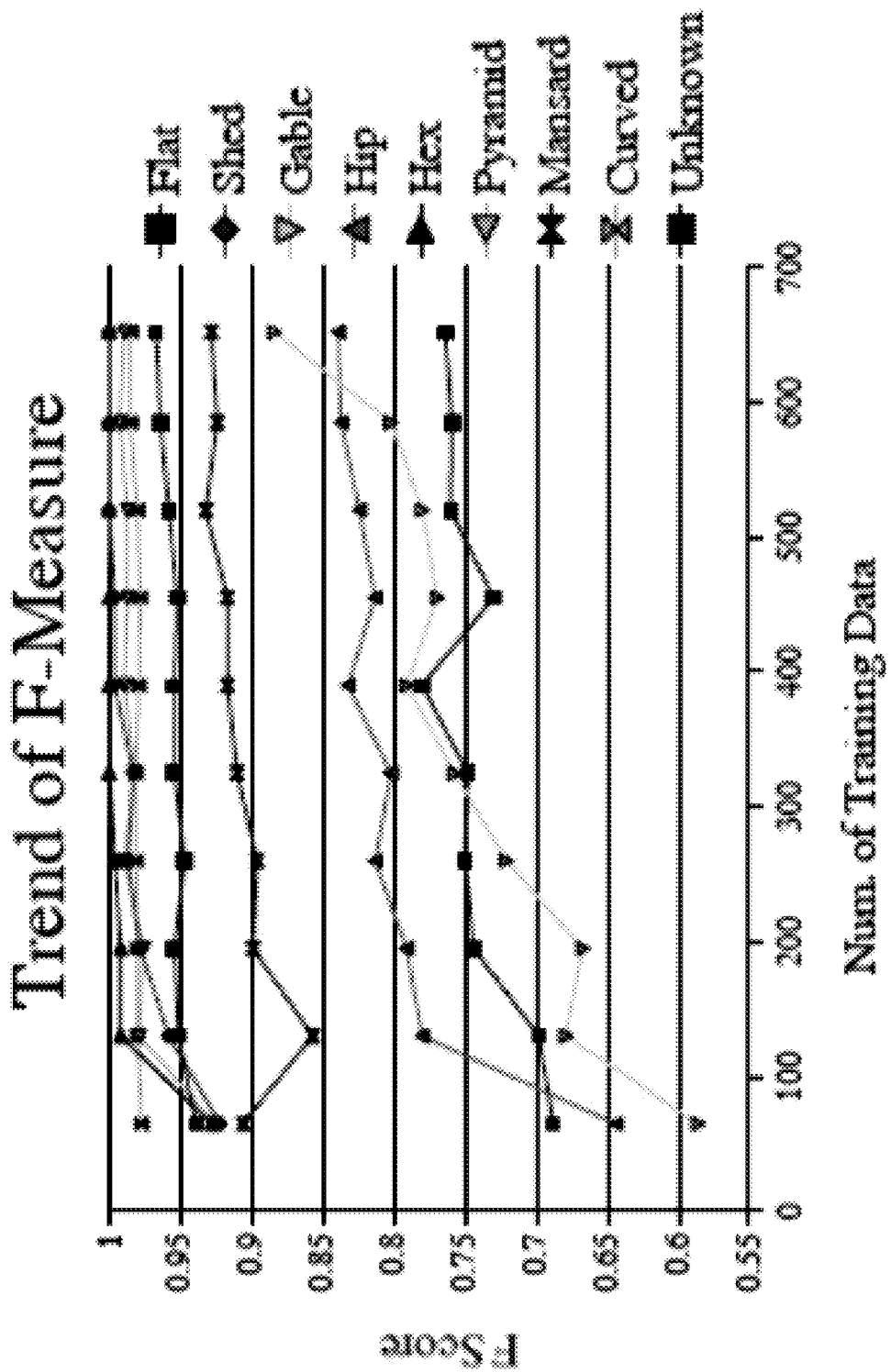
FIG. 8 illustrates an example of a trend in the accuracy or F-score for identifying a roof type based on the number of training data being used.

The trend of F-Score is depicted in FIG. 8. It may be observed from the curves in FIG. 8 that all roof types present ascending trend in the F-Score with an increased number of training data. This means that roof features created for classification are meaningful and by adding additional training data, the features do not create or add noisy boundary among data items.

Figure 9:
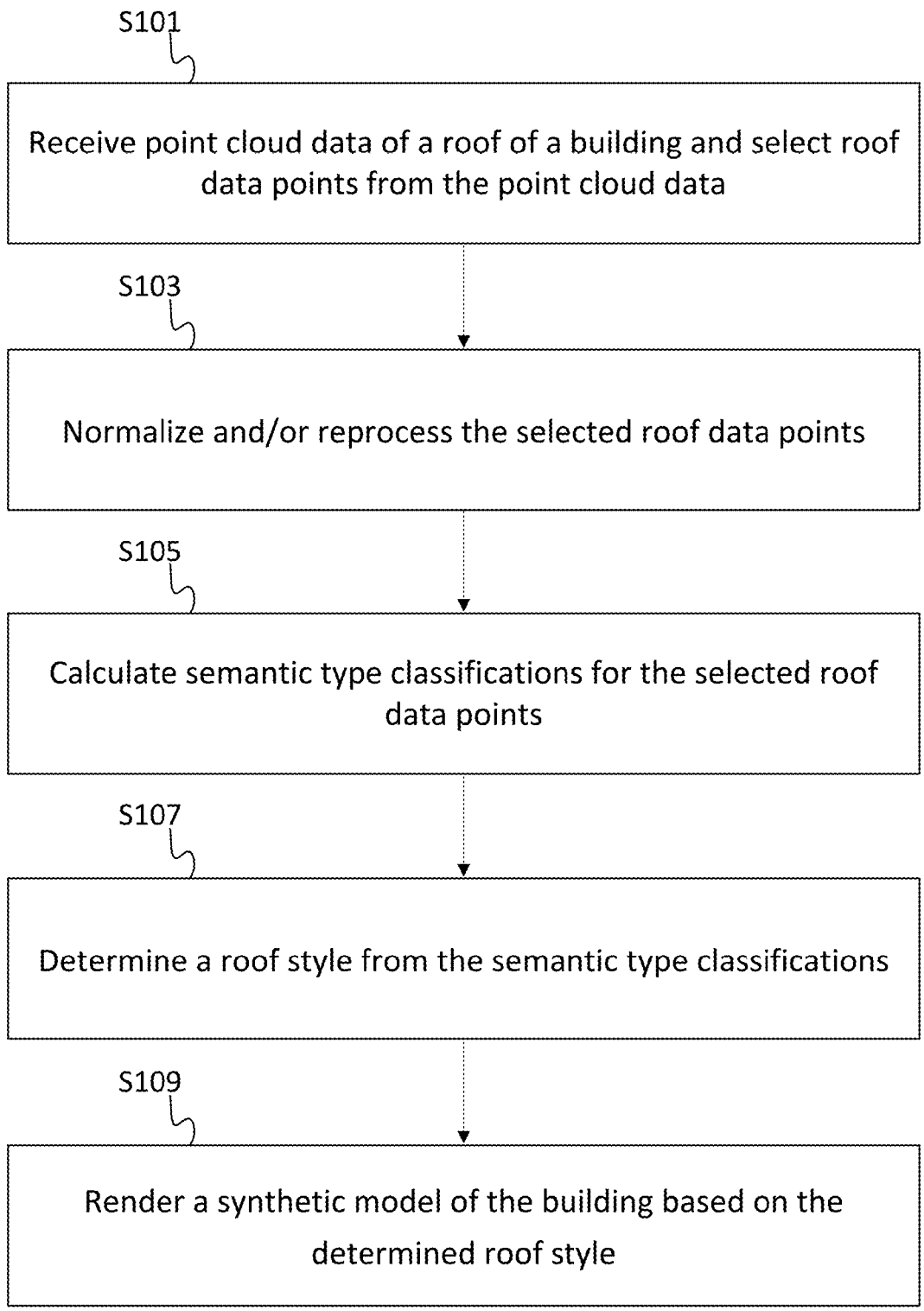
FIG. 9 illustrates an example flowchart for modeling a roof style from point cloud data.

FIG. 9 illustrates an example flowchart for roof modeling using point cloud data. The process of the flowchart may be performed by a mobile device, personal computer, or workstation and a controller and/or server and processor. Alternatively, another device may be configured to perform one or more of the following acts. Additional, fewer, or different acts may be included.

At act S101, point cloud data of a roof of a building is received, and roof data points are selected from the point cloud data for analysis. The point cloud data may be acquired using 3D optical distancing systems or intensity-based scanning techniques such as a LIDAR data acquisition system attached or otherwise integrated with a vehicle/plane. After acquisition, the point cloud data may be sent to a server/database for storage and analysis. A processor may extract the point cloud data, wherein data points from the point cloud data are selected for analysis.

At act S103, the selected roof data points are normalized and/or reprocessed. For example, the extracted point cloud data may be adjusted or normalized with synthetic roof model data in order to provide a more accurate side-by-side comparison between the real and synthetic data to which the real data is being modeled.

At act S105, the semantic type classifications are calculated for each data point of the selected, normalized/reprocessed roof data points. The semantic type classifications may be calculated from point feature vectors of the selected roof data points. In certain embodiments, the point feature vectors are determined from shape features consisting of: Eigen Features, Point Feature Histograms, Shape Distribution Features, Spin Images, or combinations thereof. In other embodiments, the point feature vectors are determined from contextual semantic features.

At act S107, a roof style is determined from the semantic type classifications. In some embodiments, the roof style is determined from a point type classifier. In other embodiments, the roof style is determined by comparing a distribution of semantic type classifications in the selected roof data points with a database of trained roof data.

At act S109, a synthetic model of the building is rendered based on the determined roof style. The reconstructed, synthetic roof may be used for mapping software and may provide global consistency and suitability for large scale map making (e.g., 3D map making).

Figure 10:
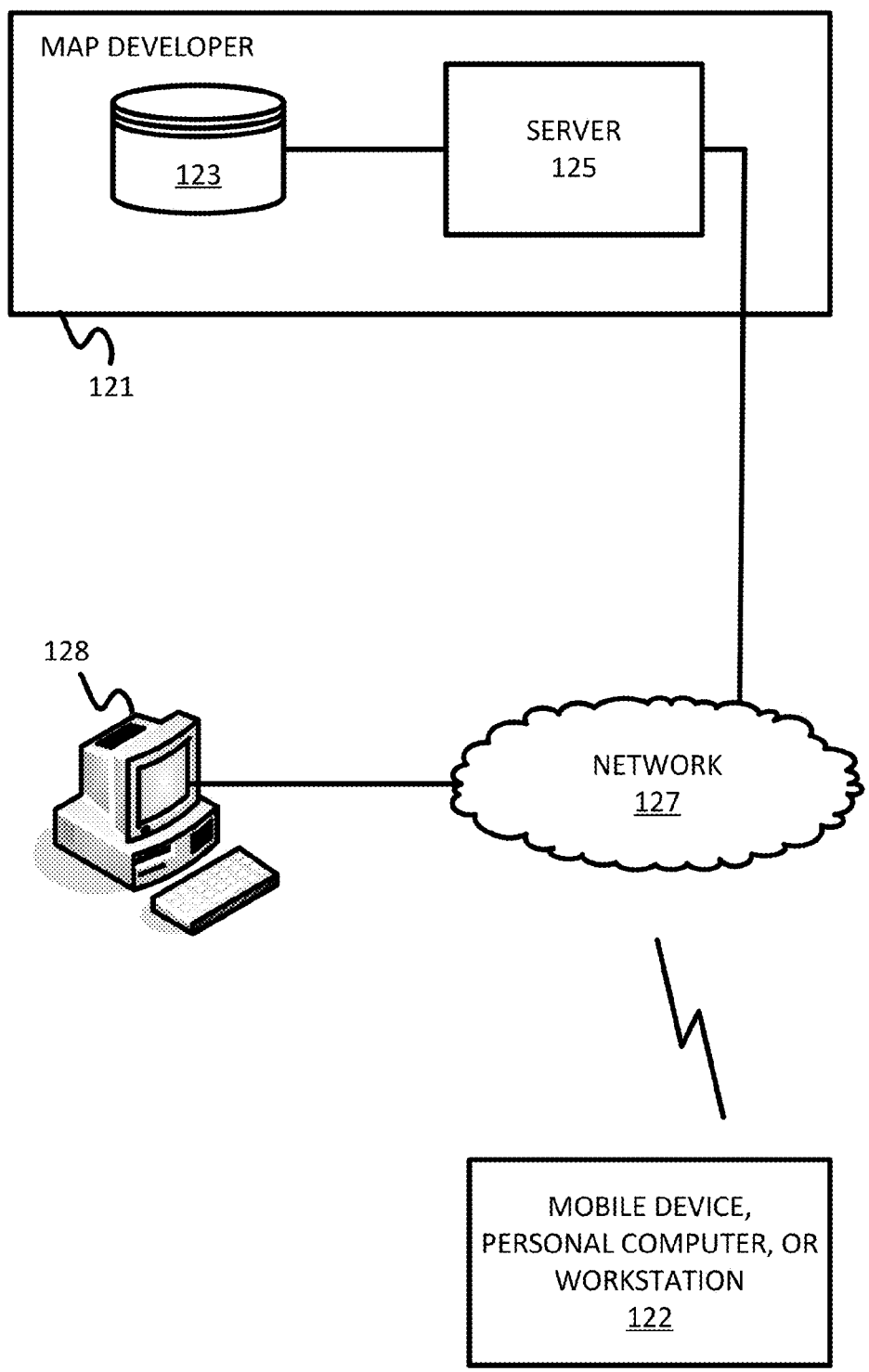
FIG. 10 illustrates an example system for receiving, processing, and/or classifying roof styles from point cloud data.

FIG. 10 illustrates an exemplary system 120. The system 120 includes a developer system 121, a mobile device, personal computer, or workstation 122, a workstation 128, and a network 127. Additional, different, or fewer components may be provided. For example, many mobile devices, personal computers, or workstations 122 and/or workstations 128 connect with the network 127. The developer system 121 includes a server 125 and a database 123. The server 125 includes at least a processor, a communication interface, and a memory.

Either or both of the device 122 and the server 125 are configured to perform the methods described above. The device 122 and the server 125 are configured to render and display a 3D model of buildings. The 3D model may be used in a navigation application or a map application. For example, the device 122 may display renderings of 3D buildings. Images of the buildings may be computer-generated or a combination of computer generated and photographic. In one example, the device 122 receives data indicative of a type of roof for a building and selects a roof style from the database for use in the building model. Alternatively, the device 122 may receive an image of the building including the computer-generated roof style. The device 122 or the server 125 is configured to access a footprint size or shape for the building in order to scale the image for the roof style.

The database 123 may pair geographic locations or building IDs with roof styles. The roof styles for corresponding buildings may be selected by analyzing images and/or range data for the buildings. One or more classification vectors are defined, which are used to analyze roofs and select the appropriate roof style.

The classification vectors are built based on training data. The device 122 or the server 125 may be configured to identify buildings from a point cloud and analyze data points of roofs of the buildings. The training data is calculated from the data points of the roofs of the buildings. The training data may be used to calculate a point classifier and a roof classifier. The classifiers include vectors and software for analyzing data. The point classifier is based on points describing the shapes of the roofs. The point classifier generates a probability of that the analyzed data corresponds to one or more of several roof style classes. The roof classifier considers a global collection of points for the roof and a statistical analysis of the types of points for each roof. The roof classifier may narrow, adjust or supplement the probability for roof style classes from the point classifier.

The device 122 and the server 125 may also be configured to assign roof styles to other buildings using the classifiers. In one example, range data for a building is received and analyzed using the point classifier and the roof classifier. The device 122 or the server 125 may be configured to select a roof style for the building based on the point classifier and the roof classifier. A three-dimensional model of the building is rendered based on the roof style.

The device 122 is a smart phone, a mobile phone, a personal digital assistant ("PDA"), a tablet computer, a notebook computer, a personal navigation device ("PND"), a portable navigation device, in-car navigation system with an ADAS safety application, and/or any other known or later developed portable or mobile device. The device 122 includes one or more detectors or sensors as a positioning system built or embedded into or within the interior of the device or vehicle 122. The device 122 receives location data from the positioning system.

The developer system 121, the workstation 128, and the device 122 are coupled with the network 127. The phrase "coupled with" is defined to mean directly connected to or indirectly connected through one or more intermediate components. Such intermediate components may include hardware and/or software-based components.

Figure 11:
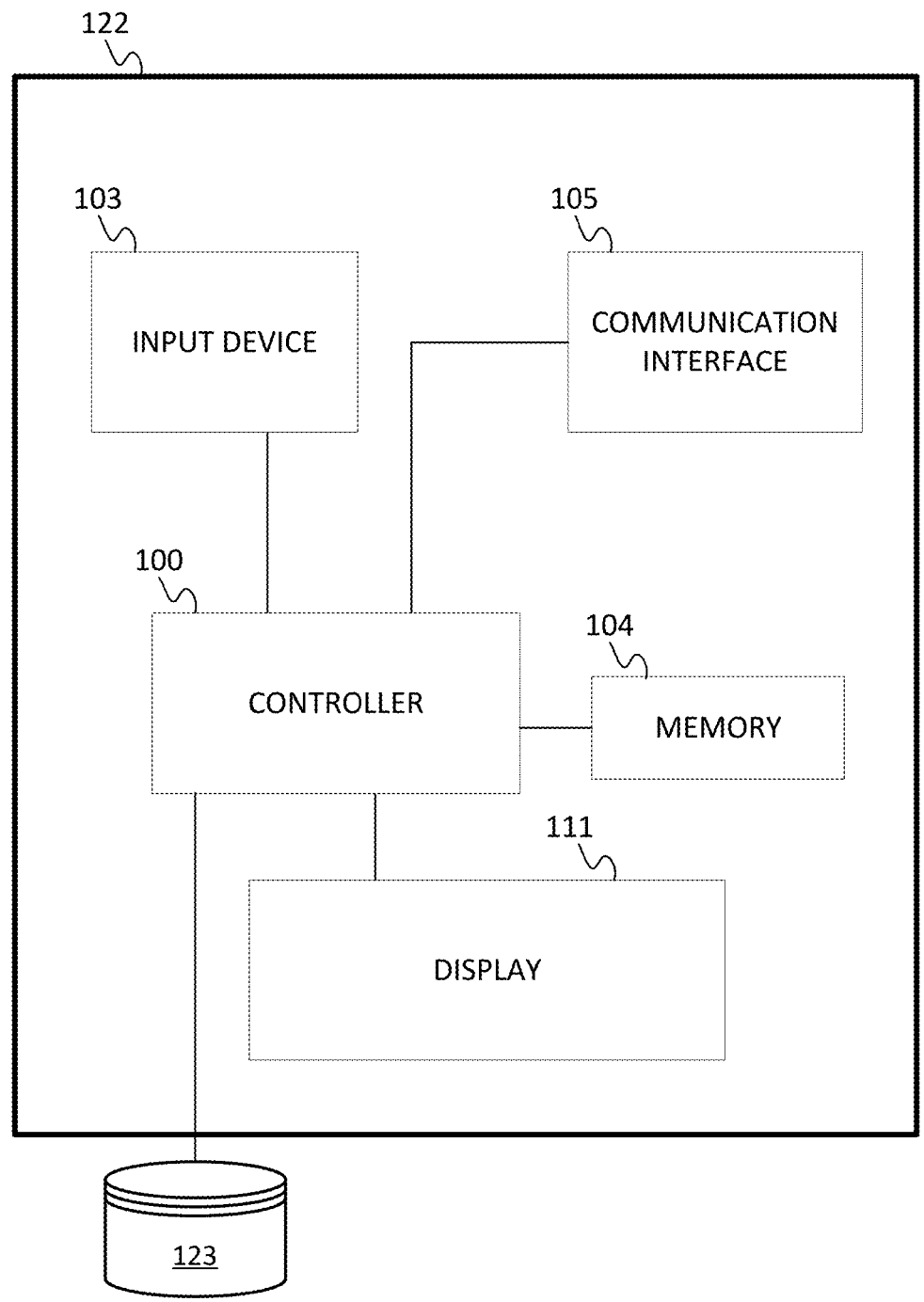
FIG. 11 illustrates an exemplary mobile device, personal computer, or workstation of the system of FIG. 9.

FIG. 11 illustrates an exemplary device of the system of FIG. 10. The device 122 may be referred to as a navigation device. The device 122 includes a controller 100, a memory 104, an input device 103, a communication interface 105, and a display 111. The device 122 may also include range finding device, range finding circuitry, position circuitry and/or a camera.

The input device 103 may be one or more buttons, keypad, keyboard, mouse, stylist pen, trackball, rocker switch, touch pad, voice recognition circuit, or other device or component for inputting data to the device 122. The input device 103 and the display 111 may be combined as a touch screen, which may be capacitive or resistive. The display 111 may be a liquid crystal display (LCD) panel, light emitting diode (LED) screen, thin film transistor screen, or another type of display. The input device 103 may be configured to receive user data indicative of the roof styles and configuration of the classification vectors.

The positioning circuitry is optional and may be excluded for the map-related functions. The positioning circuitry may include a Global Positioning System (GPS), Global Navigation Satellite System (GLONASS), or a cellular or similar position sensor for providing location data. The positioning system may utilize GPS-type technology, a dead reckoning-type system, cellular location, or combinations of these or other systems. The positioning circuitry may include suitable sensing devices that measure the traveling distance, speed, direction, and so on, of the device 122. The positioning system may also include a receiver and correlation chip to obtain a GPS signal. Alternatively or additionally, the one or more detectors or sensors may include an accelerometer built or embedded into or within the interior of the device 122. The device 122 receives location data from the positioning system, and the controller 100 is configured to select the 3D model with realistic roof modeling according to the location of the device 122.

The database 123 of the system 120 may be a geographic database. The geographic database 123 includes the 3D models including realistic roof modeling associated to geographic positions. The map-related features may be any of the navigation-related features provided to the user without reference to the current location of the user or the device. In addition, map-related features may include display and manipulation of a map of a geographic region.

The controller 100 may include a general processor, digital signal processor, an application specific integrated circuit (ASIC), field programmable gate array (FPGA), analog circuit, digital circuit, combinations thereof, or other now known or later developed processor. The controller 100 may be a single device or combinations of devices, such as associated with a network, distributed processing, or cloud computing.

The memory 104 may be a volatile memory or a non-volatile memory. The memory 104 may include one or more of a read only memory (ROM), random access memory (RAM), a flash memory, an electronic erasable program read only memory (EEPROM), or other type of memory. The memory 104 may be removable from the device 122, such as a secure digital (SD) memory card.

The communication interface 105 may include any operable connection. An operable connection may be one in which signals, physical communications, and/or logical communications may be sent and/or received. An operable connection may include a physical interface, an electrical interface, and/or a data interface. The communication interface 105 provides for wireless and/or wired communications in any now known or later developed format.

The network 127 may include wired networks, wireless networks, or combinations thereof. The wireless network may be a cellular telephone network, an 802.11, 802.16, 802.20, or WiMax network. Further, the network 127 may be a public network, such as the Internet, a private network, such as an intranet, or combinations thereof, and may utilize a variety of networking protocols now available or later developed including, but not limited to TCP/IP based networking protocols.

Non-transitory computer readable media may be encoded with instructions for performing any of the above acts or functions. While the non-transitory computer-readable medium may be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

As used in this application, the term 'circuitry' or 'circuit' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application. As a further example, as used in this application, the term "circuitry" would also cover an implementation of merely a processor (or multiple processors) or portion of a processor and its (or their) accompanying software and/or firmware. The term "circuitry" would also cover, for example, a baseband integrated circuit or applications processor integrated circuit for a mobile phone or a similar integrated circuit in server, a cellular network device, or other network device.

Processors suitable for the execution of a computer program include, by way of example, both general and special purpose microprocessors, and anyone or more processors of any kind of digital computer. Generally, a processor receives instructions and data from a read only memory or a random access memory or both. The essential elements of a computer are a processor for performing instructions and one or more memory devices for storing instructions and data. Generally, a computer also includes, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, are apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

What is claimed is:

1. A method comprising:
receiving point cloud data of a roof of a building;
selecting roof data points from the point cloud data;
normalizing the selected roof data points with synthetic roof model data, wherein normalizing the selected roof data points with synthetic roof model data includes defining a size of the roof of the building based upon a radius of a largest inscribed circle of a footprint of the building and aligning a size of a primary part of the roof with a corresponding portion of the synthetic roof model data by scaling the selected roof data points;
in response to normalizing the selected roof data points with synthetic roof model data:
calculating, using a processor, semantic type classifications for each roof data point of the selected roof data points;
determining a roof style from the semantic type classifications; and
facilitating three dimensional map rendering at a remote device by:
transmitting the building footprint and the roof style for reconstruction and rendering at the remote device.

2. The method of claim 1, further comprising resampling the selected roof data points prior to calculating the semantic type classifications.

3. The method of claim 1, further comprising normalizing the selected roof data points with synthetic roof model data and resampling the selected roof data points prior to calculating the semantic type classifications.

4. The method of claim 1, wherein the semantic type classifications are calculated from point feature vectors of the selected roof data points.

5. The method of claim 4, wherein the point feature vectors are determined from shape features consisting of: Eigen Features, Point Feature Histograms, Shape Distribution Features, Spin Images, or combinations thereof.

6. The method of claim 4, wherein the point feature vectors are determined from contextual semantic features.

7. The method of claim 1, wherein the roof style is determined using a point type classifier.

8. The method of claim 1, wherein the roof style is determined by comparing a distribution of semantic type classifications in the selected roof data points with a database of trained roof data.

9. The method of claim 8, wherein the database is updated to include the selected roof data points and determined roof type.

10. The method of claim 1, further comprising:
generating a reconstructed, synthetic roof model to match the determined roof style; and
providing the reconstructed, synthetic roof model to a map software provider for rendering of buildings in three dimensional map making of geographic regions.

11. The method of claim 1, wherein determining a roof style from the semantic type classifications further comprises:
determining a distribution of semantic parts within the roof style; and
determining the roof style based on the distribution of semantic parts within the roof style.

12. A method comprising:
receiving point cloud data of a roof of a building;
selecting roof data points from the point cloud data;
normalizing the selected roof data points with synthetic roof model data, wherein normalizing the selected roof data points with synthetic roof model data includes defining a size of the roof of the building based upon a radius of a largest inscribed circle of a footprint of the building and aligning a size of a primary part of the roof with a corresponding portion of the synthetic roof model data by scaling the selected roof data points;
calculating, using a processor, semantic type classifications for each roof data point of the selected roof data points, wherein the semantic type classifications are calculated from point feature vectors or contextual semantic features;
determining a roof style from the semantic type classifications;
rendering a synthetic model of the building based on the determined roof style; and
facilitating three dimensional map rendering at a remote device by:
transmitting the building footprint and the roof style for reconstruction and rendering at the remote device.

13. An apparatus comprising:
at least one processor; and
at least one memory including computer program code for one or more programs; the at least one memory and the computer program code configured to, with the at least one processor, cause the apparatus to at least perform:
receive point cloud data of a roof of a building;
select roof data points from the point cloud data;
normalize the selected roof data points with synthetic roof model data, wherein causing the apparatus to normalize the selected roof data points with synthetic roof model data includes causing the apparatus to define a size of the roof of the building based upon a radius of a largest inscribed circle of a footprint of the building and align a primary part of the roof with a corresponding portion of the synthetic roof model data by scaling the selected roof data points;
in response to normalizing the selected roof data points with synthetic roof model data:
calculate semantic type classifications for each roof data point of the selected roof data points;
determine a roof style from the semantic type classifications; and
facilitate three dimensional map rendering at a remote device by:

causing the apparatus to transmit the building footprint and the roof style for reconstruction and rendering at the remote device.

14. The apparatus of claim 13, wherein the at least one memory and the computer program code are configured to cause the apparatus to further perform:
resampling the selected roof data points prior to calculation of the semantic type classifications.

15. The apparatus of claim 13, wherein the semantic type classifications are calculated from point feature vectors of the selected roof data points, wherein the point feature vectors are determined from shape features or contextual semantic features.

16. The apparatus of claim 13, wherein the roof style is determined using a point type classifier.

17. The apparatus of claim 13, wherein the roof style is determined by comparing a distribution of semantic type classifications in the selected roof data points with a database of trained roof data.

18. The apparatus of claim 17, wherein the database is updated to include the selected roof data points and determined roof type.

19. The apparatus of claim 13, wherein the at least one memory and the computer program code are configured to cause the apparatus to further perform:
render a synthetic model of the building based on the determined roof style.

* * * * *